United States Patent [19]

Yokota et al.

[11] 4,391,531
[45] Jul. 5, 1983

[54] ELECTROOPTICAL DISPLAY/LEAD FRAME SUBASSEMBLY AND TIMEPIECE MODULE INCLUDING SAME

[75] Inventors: Dick Yokota, Los Gatos; David Kuty, Felton; Malcolm Kinter, Sunnyvale, all of Calif.

[73] Assignee: Timex Corporation, Waterbury, Conn.

[21] Appl. No.: 218,136

[22] Filed: Dec. 19, 1980

[51] Int. Cl.³ .............................................. H05K 5/06
[52] U.S. Cl. ...................................... 368/239; 368/84
[58] Field of Search ................ 29/177, 855, 576, 569, 29/827, 627; 339/278 C; 368/82, 83, 84, 223, 239, 240, 241, 242

[56] References Cited

U.S. PATENT DOCUMENTS

| | | | |
|---|---|---|---|
| 1,684,973 | 9/1928 | Sears | 339/278 C |
| 1,925,856 | 9/1933 | Vaughan | 339/278 C |
| 1,994,849 | 3/1935 | Bauza | 339/278 C |
| 3,910,029 | 10/1975 | Yamazaki | 368/84 |
| 3,975,899 | 8/1976 | Harber | 368/280 |
| 3,984,166 | 10/1976 | Hutchinson | 339/17 CS |
| 3,986,334 | 10/1976 | Harper | 58/50 R |
| 3,986,335 | 10/1976 | Harper | 58/50 R |
| 3,992,870 | 11/1976 | Dekel | 368/204 |
| 4,012,117 | 3/1977 | Lazzery | 339/17 L |
| 4,064,689 | 12/1977 | Yasuda | 368/84 |
| 4,065,851 | 1/1978 | Kummer et al. | 79/827 |
| 4,075,825 | 3/1978 | Murakami | 368/84 |
| 4,079,511 | 3/1978 | Grabbe | 29/827 |
| 4,083,177 | 4/1978 | Nishimura et al. | 58/23 R |
| 4,086,692 | 5/1978 | Ikuta | 29/252 |
| 4,086,752 | 5/1978 | Kishimoto | 58/23 R |
| 4,095,334 | 6/1978 | Uchida | 29/852 |
| 4,104,086 | 8/1978 | Bondur et al. | 29/576 |
| 4,120,147 | 10/1978 | Murakami | 368/239 |
| 4,142,287 | 3/1979 | Grabbe | 58/50 R |
| 4,144,705 | 3/1979 | Iimuma | 368/242 |
| 4,165,607 | 8/1979 | Fedorowitz | 350/334 |
| 4,177,554 | 12/1979 | Deveres et al. | 29/564.6 |
| 4,183,629 | 1/1980 | Nishimura | 350/334 |
| 4,185,882 | 1/1980 | Johnson | 339/176 MP |
| 4,204,317 | 5/1980 | Winn | 29/885 |
| 4,219,448 | 8/1980 | Ross | 29/885 |
| 4,335,501 | 6/1982 | Wickenden et al. | 29/569 |

FOREIGN PATENT DOCUMENTS 820900 11/1956 United Kingdom ................. 29/885

OTHER PUBLICATIONS

Organic Coatings, Materials and Processes Laboratories Autonetics, North American Aviation Inc.

*Primary Examiner*—J. V. Truhe
*Assistant Examiner*—A. Evans
*Attorney, Agent, or Firm*—William C. Crutcher

[57] ABSTRACT

The electrooptical display/lead frame subassembly comprises (a) a conductive lead frame having an integrated circuit chip supported thereon and having a plurality of conductor members terminating in a pattern of spaced resilient contact fingers defining an enclosure of selected shape therebetween and (b) an electrooptical display having a shape adapted to fit in the enclosure between the contact fingers and having spaced edge electrode contact terminals arranged such that each resilient contact finger of the lead frame frictionally engages a respective one of the electrode contact terminals to establish electrical connection and hold the display in position. Each edge contact terminal of the display comprises an inner metallized layer and a protective, conductive outer layer to minimize damage to the contact terminal resulting from frictional engagement with the resilient contact fingers of the lead frame. Preferably, the lead frame also has component conductor members which are configured to provide battery contacts, switch contacts and leads for electronic components such as capacitors, quartz crystal oscillator and the like.

A module assembly incorporating the electrooptical display/lead frame subassembly into a simple package with other components is also provided for insertion in a timepiece case. The module assembly includes a front pod member and a rear pod member releasably held together and molded with various recesses, chambers, channels and other special features to accommodate the subassembly securely between the pod members.

28 Claims, 15 Drawing Figures

ELECTROOPTICAL DISPLAY/LEAD FRAME SUBASSEMBLY AND TIMEPIECE MODULE INCLUDING SAME

FIELD OF THE INVENTION

The present invention relates to electronic timepieces equipped with an electrooptical display such as a liquid crystal display and, more particularly, to an electrooptical display/lead frame subassembly for such a timepiece as well as a module assembly incorporating the subassembly and other timepiece components in a simple package. An electrooptical display with protected edge electrode contact terminals for use in the subassembly is also disclosed as well as a method for making the display.

DESCRIPTION OF THE PRIOR ART

Myriad module assembly constructions for liquid crystal display and similar electrooptical timepieces have been developed over the past several years in an attempt to reduce the number of components, facilitate manufacture and assembly and improve the reliability of the timepiece.

For example, the Lazzery U.S. Pat. No. 4,012,117 issued Mar. 15, 1977 discloses a module assembly for a liquid crystal display watch which includes numerous components including an apertured, generally rectangular plastic frame having downwardly extending legs at each corner thereof and carrying elongated resilient conductive connectors on opposite longitudinal sides. A conventional liquid crystal display is held against the top surface of the frame by clamp means with the electrical terminals of the display in contact with the resilient connectors on the frame while a generally rectangular carrier member having holes at each corner is mounted in compression against the rear surface of the frame by inserting the legs through the holes in the carrier member and hot staking the ends of the legs against the free side of the carrier member. The carrier member has a semiconductor chip mounted centrally thereon and metallized circuit members extending from the chip and terminating along longitudinal sides of the carrier member in a plurality of contact terminals which are in contact with the resilient conductive connectors of the frame when the frame and carrier members are held together in compression. Various inputs to the semiconductor chip are provided by depending pins extending from the carrier member for insertion into a printed circuit board of known type having a quartz crystal for providing time signals, battery and the like thereon.

A somewhat similar module assembly is shown in the Yasuda et al U.S. Pat. No. 4,064,689 issued Dec. 27, 1977. However, Yasuda et al interpose a first flexible printed circuit sheet carrying a wiring pattern between the electrooptical display and the front side of a substrate carrying a semiconductor chip to connect them electrically together. A second flexible printed circuit sheet is disposed at the rear side of the substrate carrying the battery, oscillator circuit as well as other electrical components to connect the battery, oscillator circuit to certain conductors associated with the chip.

The Murakami et al U.S. Pat. No. 4,075,825 issued Feb. 28. 1978 discloses an electronic timepiece comprising an upper watch case and bottom caseback to form a so-called watch body. Sandwiched between the case and caseback inside the watch body is a lead package frame on the upper side of which is mounted an integrated circuit chip and on the bottom side of which is mounted a printed circuit board carrying a crystal oscillator, trimmer capacitor, battery, etc. The lead package frame includes an elongated slot on opposite sides of the chip to receive conductive connectors to connect the display leads to the output leads from the chip. The integrated circuit chip is mounted in a cavity in the front side of the lead package frame and epoxy resin is poured into the cavity to cover and protect the chip.

The Ikuta U.S. Pat. No. 4,086,696 issued May 2, 1978 relates to a method for packaging circuit elements for an electronic analog watch such that the conventional printed circuit board is eliminated. In this patent, a one piece lead frame is formed of copper sheet and an integrated circuit chip is die bonded directly onto the lead frame. A molded thermoplastic base plate is provided for supporting the lead frame and includes upwardly projecting studs which are adapted to pass through holes in the lead frame and to thereafter be hot staked against the lead frame to secure it on the base plate. The base plate also functions to support the gear train of the timepiece and to hold the battery. In an alternative embodiment, the assembly also includes a thermoplastic cover plate adapted to cover the entire lead frame. The cover plate is joined to the lead frame and base plate by extending the base plate studs through the cover plate followed by hot staking the studs against the cover plate. The cover plate is molded to include a housing surrounding the chip into which eopxy resin or other potting compound is placed.

The module assembly described in the Uchida U.S. Pat. No. 4,095,334 issued June 20, 1978 eliminates the need for a separate metallic lead frame. For example, the patent module assembly includes an insulating substrate or circuit board having a circuit pattern on one or both sides with an integrated circuit chip and quartz oscillator mounted on the sides and connected to the circuit pattern. This substrate is sandwiched between molded plastic front and rear frame members which are held together by hot staked legs or studs from the front frame member extending through the substrate and rear frame member. The front frame member is molded to receive an electrooptical display whereas the rear frame member is molded to receive a battery. The display leads are connected to a circuitry pattern on the substrate by conductive rubber connectors to eliminate soldering.

The Iinuma U.S. Pat. No. 4,144,705 issued Mar. 20, 1979 illustrates a module assembly in which the semiconductor chip is bonded to the lead frame and the frame/-chip assembly is positioned between upper and lower support frames. The lower support frame includes a chip-receiving cavity which is surrounded by a peripheral chamber formed into mating surfaces of the support frames and into which bonding material holding the support frames together collects and functions as a peripheral seal around the chip. A liquid crystal display is received in a suitable recess in the front surface of the upper frame while the power cell and electrical components are received in various recesses in the bottom surface of the lower frame.

The Fedorowitz et al U.S. Pat. No. 4,165.607 issued Aug. 28, 1979 discloses a module assembly in which a ceramic substrate carrying an integrated circuit chip, oscillator, incandescent bulb and other electronic components is adhered to the bottom of a molded plastic chassis member by an epoxy preform and in which a liquid crystal display and polarizer sheet are positioned against the top of the chasis member by a clip that snap-fits onto projections on the chassis. The display is connected electrically to the components on the ceramic substrate by flexible conductors. In addition, raised wall portions of the chassis member function to property align the display and polarizer sheet.

A recent effort in electrooptical display and module construction is set forth in the Nishimura et al U.S. Pat. No. 4,182,629 issued Jan. 15, 1980. This patent describes an electrooptical display having a side surface electrode lead and a module assembly incorporating such a display. The electrode lead is formed on the side surface of the rear glass plate of the electrooptical display by chemical or physical vapor deposition processes or screen printing followed by etching to provide a plurality of spaced conductive strips constituting the electrode leads. An insulating guard film is applied over the side surface electrode leads to one embodiment to protect against breakage of the leads during assembly. The module construction employs a pair of clamping plates to hold the electrooptical display to a ceramic substrate having an integrated circuit chip thereon. Conductive rubber connectors are positioned between the display and ceramic substrate to electrically connect the display electrode leads to conductors on the substrate.

Various other module assemblies for use in electronic timepieces are shown in the Yamazaki U.S. Pat. No. 3,910,029 issued Oct. 7, 1975; the Haber U.S. Pat. No. 3,975,899 issued Aug. 24, 1976; the Dekel U.S. Pat. No. 3,992,870 issued Nov. 13, 1976 and the Murakami U.S. Pat. No. 4,120,147 issued Oct. 17, 1978.

In the past, considerable effort has also been expended in attempting to electrically couple electronic or other components to an integrated circuit chip or a printed circuit board having an integrated circuit chip thereon. A typical illustration is the Hutchinson U.S. Pat. No. 3,984,166 issued Oct. 5, 1976 in which a supporting substrate is shown carrying a heat conductive stud on top of which an integrated circuit chip is attached. The substrate also carries a lead frame having a plurality of fingers bonded at one end to the chip by filamentary wires and extending at the other ends around the side walls of the substrate to form resilient spring contacts projecting below the substrate to contact multiple conductor pads on a printed circuit board positioned below the substrate.

The Johnson U.S. Pat. No. 4,185,882 issued Jan. 29, 1980 describes an electrical connector for receiving and electrically coupling to a printed circuit board having multiple, spaced electrical contact pads on one end and having a light emitting diode display array on central portions. The electrical connection comprises a body member having multiple, spaced J-shaped spring contact members attached thereon to contact the pads on the printed circuit board and also to clamp the board against the body member.

The Grabbe U.S. Pat. No. 4,079,511 issued Mar. 21, 1978 and the Deveres et al U.S. Pat. No. 4,177,554 issued Dec. 11, 1979 illustrate techniques for connecting an integrated circuit chip or printed circuit board to a lead frame.

SUMMARY OF THE INVENTION

One embodiment of the present invention involves a novel electrooptical display/-lead frame subassembly for an electronic timepiece which subassembly is advantageous as a result of its greatly simplified construction, ease of manufacture and low cost. Typically, the electrooptical display/lead frame subassembly includes (a) a conductive lead frame preferably having a central platform to which is attached an integrated circuit chip and having a plurality of individual display conductor members with inner ends spaced from edges of the central platform and connected to the integrated circuit chip, e.g., by filamentary wires, with the conductor members each having an outer end bent to form a pattern of spaced, resilient contact fingers defining an enclosure of selected shape, and (b) an electrooptical display disposed within the enclosure defined by the spaced contact fingers and having a plurality of spaced electrical contact terminals arranged preferably on display edges such that each resilient contact finger of the lead frame frictionally engages a respective one of the display contact terminals to establish electrical connection and releasably hold the display between the lead frame contact fingers. Typically, the subassembly also includes an insulating member that encapsulates the integrated circuit chip and inner ends of the conductor members of the lead frame.

In a preferred embodiment, the outer ends of the conductor members of the lead frame are bent to define first and second parallel rows of resilient contact fingers in spaced, facing relation with a generally flat, rectangular-shaped electrooptical display held therebetween, the display having multiple spaced contact terminals along opposite ends to be engaged by the resilient contact fingers.

The lead frame also preferably includes as a further important feature a plurality of component conductor members which are configured to provide battery contacts, switch contacts, leads for the oscillator circuit including capacitors and quartz crystal oscillator as well as other electronic components of the timepiece, these conductor members being spaced from the edges of the chip-supporting platform that are devoid of display conductor members and being electrically connected to the chip such as by filamentary wires.

Another embodiment of the invention involves a module assembly which incorporates the electrooptical display/lead frame subassembly, battery, quartz crystal oscillator and other timepiece components into a simple package which can be placed in a timepiece case. The module assembly includes a plastic front and rear pod member molded with various chambers and channels to accommodate and locate the aforementioned timepiece components in working relation when the pod members are held releasably together by suitable holding means associated with one or both of them. For example, one important feature of the rear pod member is that it includes on the side facing the front pod member one or more support walls defining an enclosure adapted to receive the electrooptical display/lead frame subassembly such that the walls laterally support and locate the resilient contact fingers of the lead frame. On the same side, the rear pod member preferably further includes various channels and the like to receive the capacitors, quartz crystal oscillator, switch contacts, battery leads and other components of the timepiece. On the rear side of the rear pod member is provided a battery-receiving chamber into which chamber the battery contacts extend from the front side to make electrical connection to the battery. The front pod member typically includes a recess in the rear side (facing the rear pod member) to receive the electrooptical display of the subassembly and a shaped aperture between the front and rear sides to provide a window for viewing the display. The front pod member may also include various channels or chambers which alone or in cooperation with channels or chambers in the facing side of the rear pod member provide enclosures for certain of the timepiece components, particularly the quartz crystal oscillator. The front and rear pod members are held releasably together by, for example, projecting studs from the rear pod member being frictionally received in corresponding bores in the front pod member.

In a particular preferred embodiment of the invention, the rear pod member includes on the side facing the front pod member an abutting wall and support wall spaced from one another and defining an enclosure therebetween in which is received a display/lead frame subassembly somewhat different from that described above. In particular, the display includes spaced electrical contact terminals on only one display edge and the lead frame includes only one row of spaced resilient contact fingers to engage the display contact terminals. This subassembly is positioned in the enclosure such that the support wall of the rear pod member laterally supports and locates the row of resilient contact fingers which are engaged against the edge contact terminals of the display and the abutting wall functions as a stop for abutment against an edge of the display devoid of contact terminals. Preferably, the support wall and abutting wall are generally in spaced, parallel relation to support and abut respectively opposite edges of the display.

The electrooptical display of the subassembly generally includes a transparent front planar substrate carrying a display electrode and a rear planar substrate carrying another electrode, the substrates having co-extensive outer edges with the electrodes on each substrate terminating at the co-extensive edges in electrode leads. An important feature of the electrooptical display is that the edges are completely metallized or otherwise coated with a metallic layer after the display is assembled to contact the electrode leads and the edges are then coated with an etch-resistant, conductive coating, such as carbon-filled epoxy, at selected, spaced areas along the edges corresponding to the electrode lead locations. This is followed by etching away of the uncoated metallized layers to form a plurality a spaced, protected contact terminals along the edges to be frictionally engaged by the spaced resilient contact fingers of the lead frame. That is, each edge contact terminal comprises a metallic inner layer and conductive, protective outer layer.

BRIEF DESCRIPTION OF THE DRAWINGS

For a more complete understanding of the invention, reference is made hereafter to the drawings in which.

DESCRIPTION OF PREFERRED EMBODIMENTS

Figure 1:
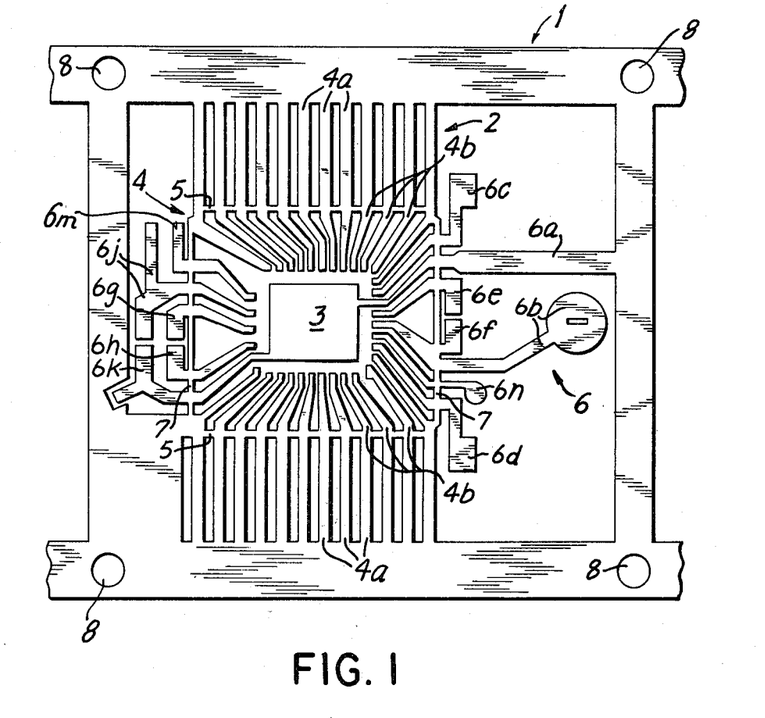
FIG. 1 is a top plan view of a portion of the metallic carrier strip into which the lead frame pattern is punched.
Figure 2:
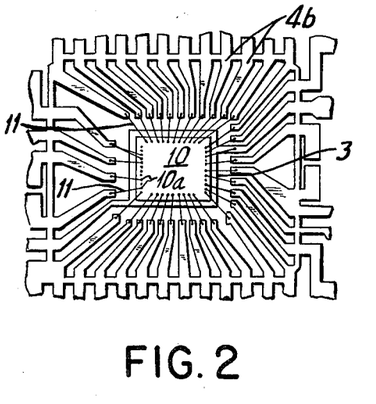
FIG. 2 is a top plan view of the lead frame pattern with the integrated circuit chip attached thereto.
Figure 3:
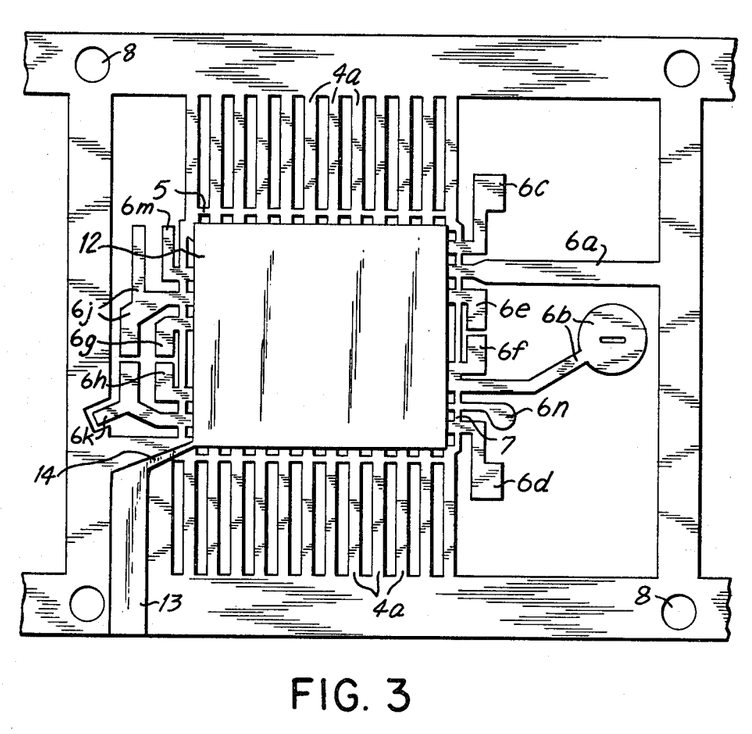
FIG. 3 is a top plan view of FIG. 1 after the plastic injection molding step to form insulating member 12.

Stages in the manufacture of the lead frame employed in the electrooptical display/lead frame subassembly are illustrated in FIGS. 1, 2 and 3. FIG. 1 shows the lead frame 2 as chemically etched, punched or stamped into a carrier strip 1 of KOVAR ® or other suitable material. The lead frame includes a central rectangular platform 3 and display conductor members 4 spaced from opposite longitudinal edges of the central platform. The display conductor members 4 have outer ends 4a generally parallel with one another and inner ends 4b which converge together but nevertheless remain spaced apart as they approach the longitudinal edges of the central platform. The display conductor members 4 at this stage are supported and held together by lateral bridges 5 throughout the lead frame pattern as is well known in the art. Portions of the inner ends 4b nearest central platform 3 are coated with a layer of nickel then a layer of silver to facilitate subsequent wire bonding to an integrated circuit chip subsequently attached to central platform 3 as described below.

As is apparent, the lead frame also includes component conductor members 6 spaced from the transverse edges of the central platform. Each component conductor path includes an inner end spaced from the transverse edge of the central platform 3 for wire bonding to the integrated circuit chip and an outer end especially configured to serve a particular electrical circuit component function. For example, outer ends 6a and 6b provide positive and negative battery contacts, outer ends 6c and 6d provide switch contacts, outer ends 6e and 6f, and 6g and 6h provide bonding pads on which a capacitor is mounted, outer ends 6j and 6k provide bonding pads for a capacitor and 6j along with 6m further provides a lead for connection to the quartz crystal oscillator (FIG. 5) and outer end 6n provides a circuit test pad. The component conductor members are supported and held together at this stage by lateral bridges 7. Since the inner ends of the component conductor members, except those of 6a and 6k, are wire bonded to the integrated circuit chip, portions thereof nearest the transverse edges of the central platform are coated with a layer of nickel followed by a layer of silver. The inner ends of component conductor members 6a and 6k are connected integrally to platform 3 for electrical grounding purposes.

Those skilled in the art will appreciate that a plurality of lead frame patterns can be etched or punched end-to-end along the length of the metallic carrier strip 1 by automatic machines. Corner holes 8 in the strip serve as locating means during the punching step as well as during subsequent operations such as attachment of the integrated circuit chip 10 onto the central platform 3 and wire bonding the coated inner ends of the display conductor members 4 and component conductor members 6 to the chip, FIG. 2. The chip 10 is attached to the central platform 3 by adhesive or other known conventional techniques such as die bonding. The chip may be attached by conductive or non-conductive adhesive depending on the particular circuitry employed. In the wire bonding operation, filamentary gold wires 11 are soldered or otherwise bonded electrically between the inner ends of the conductor members and terminal pads 10a provided on the chip 10. These operations are well known to those skilled in the art.

Figure 4:
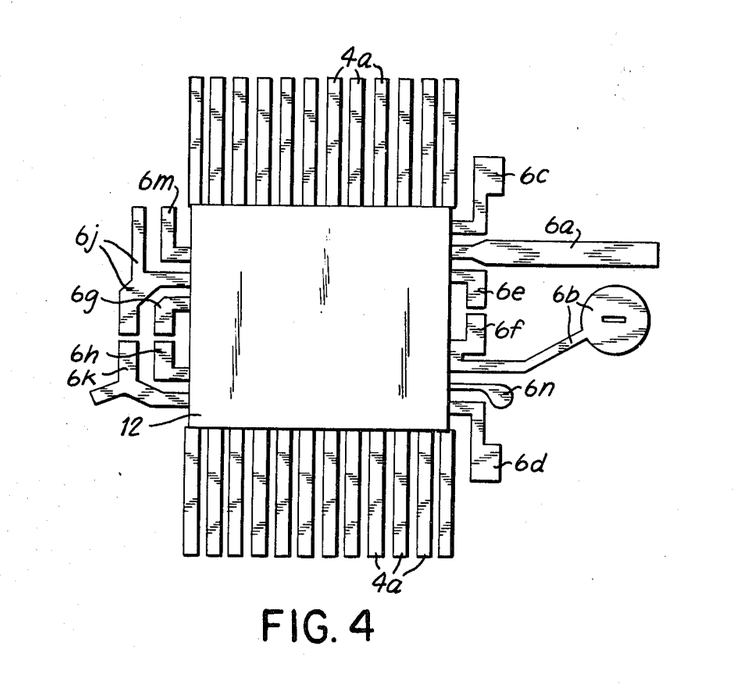
FIG. 4 is a top plan view of the lead frame pattern after separation from the carrier strip.

FIG. 3 illustrates a typical lead frame pattern after being subjected to a transfer molding operation to form plastic insulating member 12 thereon encapsulating the integrated circuit chip 10 and inner ends of display conductor members 4 and component conductor members 6. The plastic insulating member typically is formed on both sides of the central platform and of the inner ends of the conductor members (shown most clearly in FIG. 6). The insulating member 12 is formed in the rectangular shape on both sides of lead frame by well known transfer molding techniques. A runner and gate are used in the mold to introduce plastic, such as epoxy, into the mold cavity and these in turn cause a molded plastic runner 13 and molded plastic gate 14 to be formed on portions of the metallic strip along with formation of the insulating member 12 on the lead frame pattern. Of course, these molded features are removed from the insulating member 12 prior to the lead frame being free from the metallic carrier strip by shearing or other trimming operation, as shown freed in FIG. 4.

Figure 5:
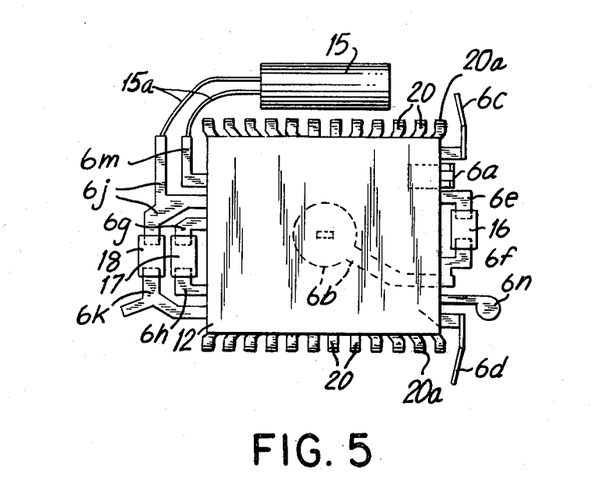
FIG. 5 is a top plan view of the finished lead frame after die pressing and after attachment of electronic components.
Figure 6:
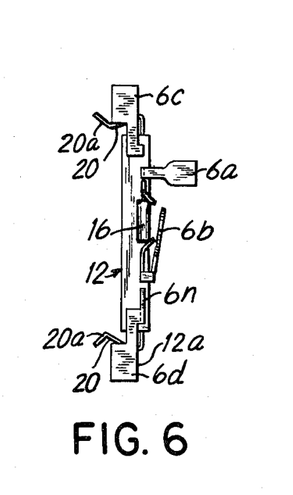
FIG. 6 is a side elevation of FIG. 5.

FIGS. 5 and 6 show the lead frame/insulating member after die pressing to form and bend the outer ends of the display conductor members 4 and component conductor members 6 to desired working shapes and positions and after electronic components such as quartz crystal oscillator 15 and capacitors 16, 17 and 18 have been attached. It is apparent from the figures that outer ends 4a of the display conductor members have been bent into generally L-shaped resilient contact fingers 20 each having a contact point 20a. The resilient contact fingers are formed into first and second parallel rows facing one another from opposite edges of the insulating member 12 with the individual contact fingers in one row in face-to-face registry with those in the other row. The rows define a generally rectangular channel therebetween into which the electrooptical display can be disposed as described herebelow. It is important to properly bend the outer ends of the display conductor members 4 so that sufficient spring action is imparted to the contact fingers to grip the display and provide electrical contact. The contact finger configuration illustrated in the figures has proved satisfactory in this regard.

The outer ends of component conductor members 6a and 6b are bent downwardly behind the rear side 12a of the insulating member 12 to provide positive and negative battery contacts. The positive battery contact is provided by bending the outer end of conductor path 6a into a generally U shape so that it contacts the side of the battery and the negative contact is provided by bending conductor path 6b in overlapping relation to the rear side 12a, as shown in dashed lines in FIG. 5, to contact the top or negative terminal of the battery. The outer ends of conductor members 6c and 6d are likewise bent to provide switch contacts at one edge of the insulating member 12 facing transversely relative to its long axis. And, outer ends 6e and 6f, 6g and 6h and 6i and 6k are bent downwardly in a truncated V-shape to provide a pocket to receive the capacitors 16, 17 and 18, respectively, e.g., as shown best in FIG. 6.

Capacitors 16, 17 and 18 are attached to the bent outer ends of the component conductor members 6 by conductive adhesive or other well known means. Quartz crystal oscillator 15 has leads 15a soldered to component conductor members 6m and 6j as shown.

Figure 7:
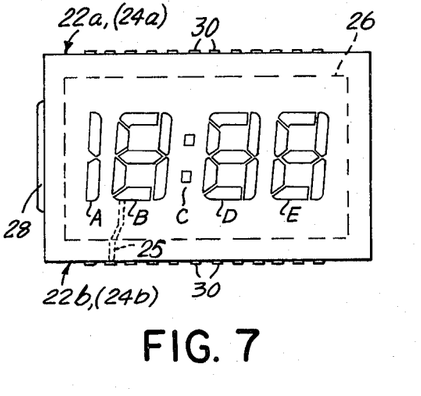
FIG. 7 is a top plan view of the electrooptical display.
Figure 8:
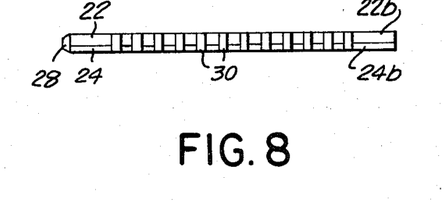
FIG. 8 is a side elevation of FIG. 7.

An electrooptical display useful in the present invention in conjunction with the lead frame is shown in FIGS. 7 and 8. The display includes transparent front and rear substrates 22 and 24, respectively, each having transparent electrodes on the facing surfaces, e.g., indium oxide electrode layers. An important feature of the substrates is that the substrates 22 and 24 are coextensive, at least along the longitudinal edges 22a and 24a and 22b and 24b. The transparent electrodes on front substrate 22 (or rear substrate 24) are patterned into individual segments forming display characters A–E with each electrode segment terminating at longitudinal edges 22a and 22b in an electrode lead 25, e.g., shown partially in FIG. 7. The rear substrate 24 includes a common electrode (not shown) which may terminate similarly in an electrode lead at either longitudinal edge 24a or 24b. The particular display character pattern and arrangement used as well as techniques for forming the electrodes are well known in the art. The substrates are spaced apart slightly, e.g., 10 microns, by a gasket material such as screen printed epoxy or glass frit 26 and the space is filled with an electrooptical material, typically liquid crystal material or other known materials used in electrooptical displays. The liquid crystal material is introduced into the display at one end and then the access opening is sealed by sealant bead 28.

An important feature of the display is the provision of first and second rows of protected, spaced contact terminals 30 in the form of stripes along the longitudinal coextensive edges 22a and 24a and 22b and 24b, each contact terminal being connected electrically to a transparent electrode lead terminating at the substrate edges. The terminals are electrically connected to the electrode leads by first completely metallizing the longitudinal edges and then depositing an etch-resistant, conductive layer in the striped pattern shown. Thereafter, the uncoated metallized areas are etched away by suitable acid, leaving the pattern of contact terminals shown in FIGS. 7 and 8 with each contact terminal comprising an inner metallized layer contacting the transparent electrode lead at that location and a protective, conductive outer layer. The metallized layer may comprise MONEL ® or other metal such as gold evaporated or sputtered onto the edges and the protective, conductive layer may comprise carbon-filled epoxy screen-printed or applied by other appropriate means onto the edges. It is necessary in the invention to employ the protective, conductive outer layer over the metallized layer since the resilient contact fingers of the lead frame will frictionally engage against the contact terminals 30 of the display and such contact could damage or destroy a thin unprotected metallic layer. The thickness of the metallic layer is typically 10,000 A and the thickness of the carbon-filled epoxy layer is 0.0005 to 0.001 inch.

Figure 9:
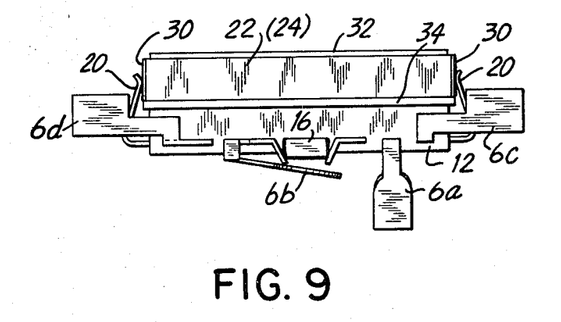
FIG. 9 is a side elevation of the lead frame with the electrooptical display positioned between the resilient contact fingers.

FIG. 9 shows the electrooptical display/lead frame subassembly of the invention with the resilient finger contacts 20 engaged against the contact terminals 30 of the display to effect electrical connection therebetween and also to hold the display in proper position. Front polarizer 32 and rear polarizer/reflector 34 are attached to the display, e.g., by adhesive, prior to insertion between the finger contacts of the lead frame. It is apparent that a simple package including the electrooptical display, lead frame and electronic components such as capacitors, quartz crystal oscillator, battery contacts and switch contacts is thereby provided. This subassembly is then inserted into a module assembly adapted to fit within a timepiece case.

Figure 10:
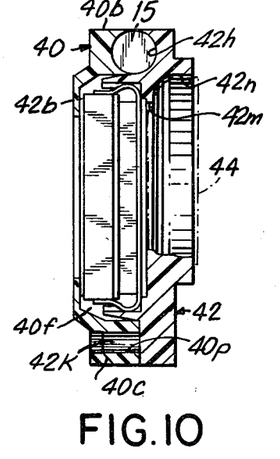
FIG. 10 is a cross-section through the module assembly.
Figure 11:
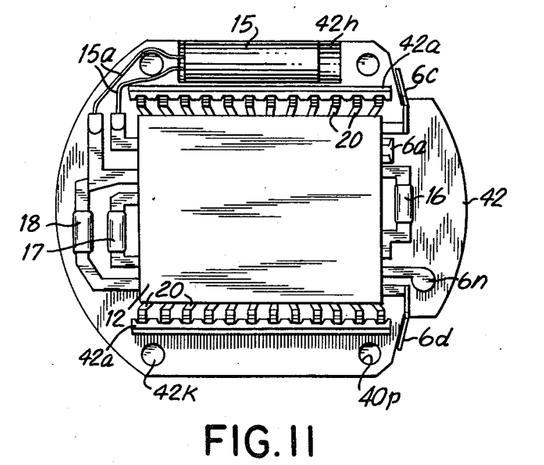
FIG. 11 is a top plan view of the module assembly with the front pod member and display removed.
Figure 12:
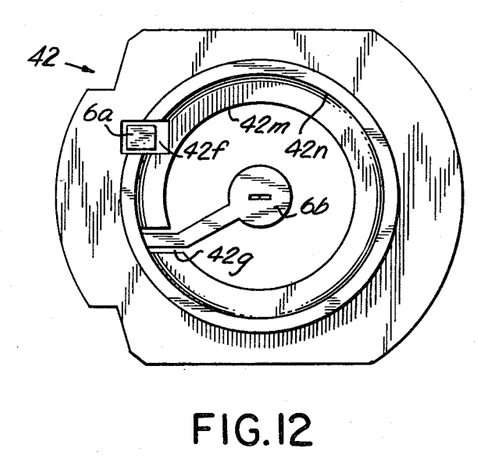
FIG. 12 is a bottom plan view of the module assembly.

FIGS. 10, 11 and 12 show the module assembly as comprising a front pod member 40 and rear pod member 42 between which is housed the subassembly of FIG. 9. The front and rear pod members preferably are molded plastic, e.g., glass filled nylon, and have various chambers, recesses, channels and the like molded therein to accommodate various features of the subassembly. For example, on the front side of the rear pod member 42 are molded upstanding, ribbed support walls 42a facing one another, FIG. 13. The ribs of each wall define spaced, facing channels 42b which are adapted to receive, position and support the resilient contact fingers of the lead frame, see FIG. 11. Also, molded into the front side of the rear pod member are rectangular recesses 42c, 42d and 42e adapted to receive capacitors 16, 17 and 18, respectively, and through-channels 42f and 42g through which battery contacts 6a and 6b respectively extend behind the rear pod member, FIG. 12. An elongated cylindrical recess 42h is molded along one longitudinal side of the rear pod member to receive the bottom part of quartz crystal oscillator 15, see FIG. 10. Vertical attachment posts 42k are molded onto the front side of the rear pod member and are adapted to be frictionally received in corresponding holes 40p in the front pod member to hold the module assembly together, also FIG. 10.

Figure 13:
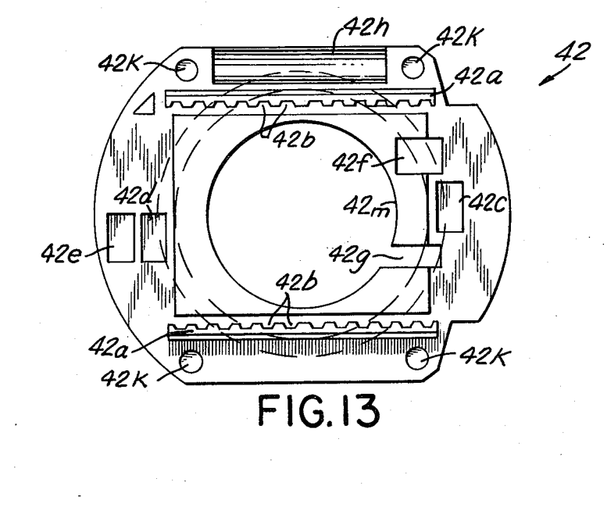
FIG. 13 is a top plan view of the rear pod member.

The rear pod member further includes a central, circular aperture 42m which communicates with a larger-diameter circular recess 42n in the rear side thereof to form a battery-receiving chamber, FIGS. 10, 12 and 13. The battery 44 (dashed lines FIG. 10) is of the conventional button cell type.

Figure 14:
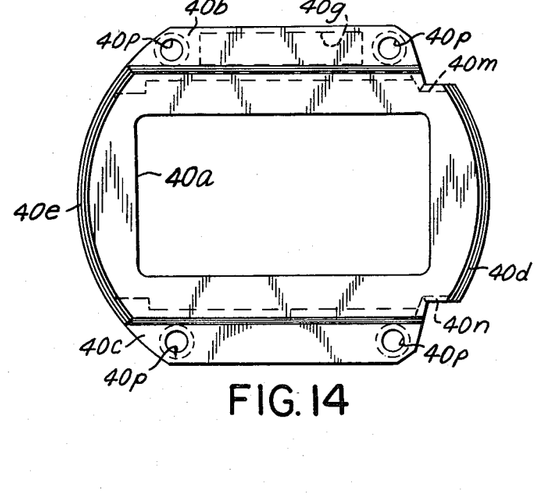
FIG. 14 is a top plan view of the front pod member.

The front pod member 40 is shown in greater detail in FIG. 14. It is generally tray-shaped having a flat front side with a central rectangular aperture 40a defining a window for viewing the electrooptical display therebelow. The depending walls 40b, 40c, 40d and 40e of the front pod member define an enclosure 40f which receives the electrooptical display, FIG. 10. An elongated cylindrical chamber 40g is molded in the depending wall 40b situated above the quartz crystal oscillator 15 to cooperate with a similar chamber 42h in the rear pod member to house the oscillator. End wall 40d has slots 40m and 40n through which switch contacts 6d and 6d extend when the front pod member is engaged to the rear pod member. Engagement is achieved by providing holes 40p through the front pod member and inserting posts 42k of the rear pod member therein, the holes and posts being sized to provide frictional engagement therebetween FIG. 10.

As can be seen from the figures, especially FIG. 10, the module assembly provides a simple means for packaging the important components of an electronic timepiece employing an electrooptical display for placement as an overall unit into a timepiece case (not shown) having push buttons to engage against switch contacts 6c and 6d to change functions of the timepiece.

Figure 15:
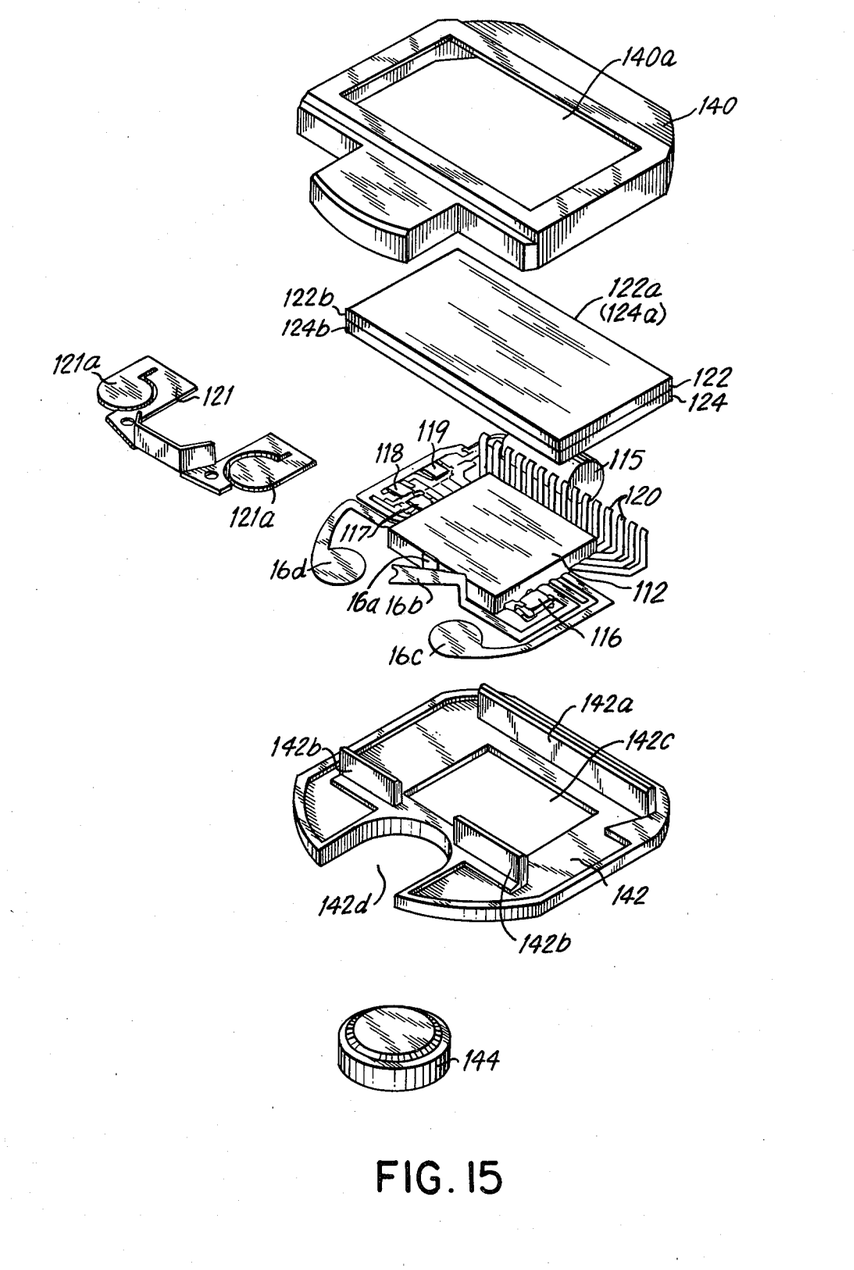
FIG. 15 is a perspective view of a modified module assembly.

Another embodiment of the invention particularly advantageous for a thin ladies 3½ digit timepiece is shown in FIG. 15. In this embodiment, the lead frame/insulating member includes display conductor members bent to form one row of spaced, resilient contact fingers 120 and further includes component conductor members defining for example positive and negative battery contacts 16a and 16b, respectively, switch contacts 16c and 16d and other features for connection to quartz crystal 115 and capacitors 116, 117, 118 and 119. Insulating member 112 encapsulates the integrated circuit chip (not shown) as well as the inner ends of the display conductor members and component conductor members as described in the above-mentioned embodiments. A switching plate 121 is employed and includes resilient discs 121a which are engaged by pushbuttons (not shown) in the timepiece case and are depressible onto the switch contacts 16c and 16d to change timepiece functions.

The electro-optical display employed in this embodiment is similar to that described hereinabove and shown in FIGS. 7 and 8 except that the protected, spaced contact terminals (not shown) corresponding to contact terminals 30 are provided along only coextensive edges 122a and 124a of the display to be engaged by the single row of resilient contact fingers 120.

The rear pod member 142 includes a support wall 142a that functions to provide lateral support to the resilient contact fingers 120 and a pair of abutting walls 142b which function as a stop for abutment against the edges 122b and 124b of the electrooptical display which is biased toward the abutting walls by the row of resilient contact fingers 120. A rectangular aperture 142c is provided in the rear pod member to receive part of insulating member 112. A slot 142d is also provided to receive button cell 144.

The front pod member 140 is releasably attached to the rear pod member and includes a central opening 140a to provide a window for viewing the display as well as other chambers, etc., for accommodating quartz crystal 115 and battery 144.

While the invention has been explained by a detailed description of preferred embodiments, it is to be understood that various modifications and substitutions can be made thereto within the scope of the appended claims which are intended to include equivalents of such embodiments.

I claim:

1. A subassembly for an electronic display device, comprising:
   a. a conductive lead frame carrying an integrated circuit chip and having a plurality of spaced conductor members each with an inner end connected electrically to said chip and each with an outer end formed into a resilient contact finger, the contact fingers being arranged in a preselected pattern to define an enclosure, and
   b. an electrooptical display having longitudinal edges positioned within said enclosure, said display having display electrodes and a plurality of contact terminals connected to said electrodes and spaced along its edges in such a pattern that each resilient contact finger of the lead frame frictionally engages a respective one of the contact terminals when the display is positioned in said enclosure, thereby establishing electrical connection therebetween and releasably holding the display between said contact fingers.

2. The subassembly of claim 1 further including an insulating member encapsulating the integrated circuit chip and the inner ends of the conductor members of the lead frame.

3. The subassembly of claim 1 wherein the lead frame further includes a plurality of spaced component conductor members each having an inner end connected electrically to said chip and each having an outer end configured to provide circuit means associated with said chip.

4. The subassembly of claim 1 wherein the electrooptical display comprises first and second spaced, planar substrates having coextensive longitudinal edges and carrying a pattern of transparent electrodes with the electrodes terminating at said substrate edges in spaced electrode leads, said display including contact terminals spaced apart along said edges and coinciding in position with the position of said electrode leads to provide electrical connection therebetween.

5. The subassembly of claim 4 wherein each edge contact terminal comprises an inner metallic layer and protective, conductive outer layer.

6. A subassembly for an electronic display device, comprising:
 a. a conductive lead frame having a central platform carrying an integrated circuit chip and having a plurality of spaced conductor members adjacent opposite edges of the central platform with the conductor members each having an inner end connected electrically to the integrated circuit chip and each having an outer end bent to form a resilient contact finger oriented in relation to the other contact fingers such that first and second rows of spaced contact fingers are provided facing one another;
 b. an insulating member encapsulating the integrated circuit chip and inner ends of the conductor members of the lead frame; and
 c. an electrooptical display positioned between the first and second rows of resilient contact fingers, said display having generally planar first and second electrode-bearing substrates with opposite edges which are coextensive and on which edges a plurality of spaced contact terminals connected to the substrate electrodes are disposed in such configuration that each resilient contact finger of the lead frame frictionally engages a respective one of the contact terminals when the display is positioned between said first and second rows, thereby establishing electrical connection therebetween and releasably holding the display between said contact fingers.

7. The subassembly of claim 6 wherein the lead frame further includes a plurality of spaced component conductor members adjacent the other edges of the central platform with the component conductor members each having an inner end connected electrically to the integrated circuit chip and each having an outer end configured to provide circuit means associated with said chip.

8. A module assembly for an electronic information display device, comprising:
 a. a subassembly comprising a conductive lead frame carrying an integrated circuit chip and having display conductor members connected electrically to said chip and terminating in a pattern of resilient contact fingers defining an enclosure and an electrooptical display with edges disposed within said enclosure and having display electrodes and a plurality of contact terminals connected to said display electrodes and spaced along the display edges in such a manner that each resilient contact finger frictionally engages a respective one of the display contact terminals;
 b. a plastic rear pod member having a front side with a wall defining a chamber in which the subassembly is disposed with the resilient contact fingers supported by said wall and with the electrooptical display held between said contact fingers; and
 c. a plastic front pod member having a recess on the side thereof facing said rear pod member to receive the electrooptical display of the subassembly and having an aperture therethrough in communication with said recess to provide a window for viewing the display, said front pod member and rear pod member having holding means associated therewith for releasably holding them together with the subassembly therebetween.

9. The module assembly of claim 8 wherein the lead frame of the subassembly further includes a plurality of component conductor members connected electrically to said chip and terminating in circuit component means and wherein said rear pod member includes molded compartments for accommodating said circuit component means.

10. The module assembly of claim 8 wherein the rear pod member wall supporting the resilient contact fingers includes spaced ribs which separate the contact fingers from one another.

11. A module assembly for an electronic display device, comprising:
 (a) a subassembly comprising a conductive lead frame carrying an integrated circuit chip and having display conductor members connected electrically to said chip and terminating in a line of spaced resilient contact terminals, and an electrooptical display having multiple display electrodes and a plurality of contact terminals connected to said display electrodes and spaced along one edge of the display in such a manner that each resilient contact finger frictionally engages a respective one of the display contact terminals;
 (b) a plastic rear pod member having a front side with a support wall and an abutting wall in spaced apart relation to define a chamber in which the subassembly is disposed with the resilient contact fingers supported by said support wall and with another edge of the display abutted against the abutting wall, the subassembly being held between the support wall and abutting wall by spring action of said resilient contact fingers; and
 (c) a plastic front pod member having a recess on the side thereof facing said rear pod member to receive the electrooptical display of the subassembly and having an aperture therethrough in communication with said recess to provide a window for viewing the display, said front pod member and rear pod member having holding means associated therewith for releasably holding them together with the subassembly therebetween.

12. The module assembly of claim 11 wherein the support wall and abutting wall of the rear pod member are in spaced, parallel relationship to receive therebetween a rectangular display with opposite, parallel edges one of said edges having said contact terminals thereon.

13. The display of claim 11 wherein the outer layer is carbon-filled epoxy.

14. A subassembly for an electronic display device, comprising:
  a. a conductive lead frame carrying an integrated circuit chip and having a plurality of spaced conductor members each with an inner end connected electrically to said chip and each with an outer end formed into a resilient contact finger, the resilient contact fingers being arranged in a first pattern, and
  b. an electrooptical display having multiple display electrodes terminating in spaced apart relation along at least one edge of the display and having a plurality of spaced contact terminals connected to said electrodes along the edge in a second pattern complementary to said first pattern of resilient contact fingers, said display and lead frame being in operative association such that each resilient contact finger of said lead frame frictionally engages a respective one of the contact terminals of said display, establishing electrical connection therebetween.

15. The subassembly of claim 14 further comprising an insulating member encapsulating the integrated circuit chip and inner ends of the conductor members of the lead frame, said insulating member being disposed behind and supporting the electrooptical display.

16. The subassembly of claim 14 wherein the resilient contact fingers of said lead frame are arranged in a linear, spaced-apart pattern, and the contact terminals of said display are arranged along an edge thereof in a linear, spaced-apart pattern.

17. The subassembly of claim 14 wherein the electrooptical display comprises first and second spaced, planar substrates having coextensive edges and carrying a pattern of transparent electrodes with the electrodes terminating at said coextensive edges in spaced electrode leads, said contact terminals being spaced apart along said edges and coinciding in position with the position of said electrode leads to provide electrical connection therebetween.

18. A subassembly for an electronic display device, comprising:
  a. a conductive lead frame carrying an integrated circuit chip, said lead frame having a plurality of spaced display conductor members each with an inner end connected electrically to said chip and each with an outer end terminating in a resilient contact finger, the resilient contact fingers being arranged in a first pattern, and having a plurality of spaced component conductor members each with an inner end connected electrically to said chip and each with an outer end configured to provide circuit means in association with said chip, and
  b. an electrooptical display having multiple display electrodes terminating in spaced-apart relation along an edge of the display and having a plurality of spaced contact terminals connected to said electrodes along said edge in a second pattern complementary to said first pattern of resilient contact fingers, said display and lead frame being in operative association such that each resilient contact finger of the lead frame frictionally engages a respective one of the contact terminals of said display, establishing electrical connection therebetween.

19. The subassembly of claim 18 wherein the circuit means formed by the outer ends of said component conductor members includes a battery contact, a switch contact and electrical leads.

20. The subassembly of claim 18 further comprising an insulating member encapsulating the integrated circuit chip and inner ends of the display conductor members, said insulating member being disposed behind and supporting the electrooptical display.

21. The subassembly of claim 18 wherein the resilient contact fingers of said lead frame are arranged in a linear, spaced-apart first pattern, and the contact terminals of said display are arranged in a complementary linear, spaced-apart second pattern on said edge of the display.

22. A subassembly for an electronic display device, comprising:
  a. conductive lead frame carrying an integrated circuit chip and having a plurality of spaced conductor members each with an inner end connected electrically to said chip and each with an outer end formed into a resilient contact finger oriented in relation to the other contact fingers such that a single row of spaced apart resilient contact fingers is provided,
  b. an electrooptical display having multiple display electrodes terminating in spaced apart relation along one edge of the display and having a plurality of spaced contact terminals connected to said electrodes along said one edge, and
  c. means for holding the display and lead frame in operative association with each resilient contact finger of said lead frame frictionally engaging a respective one of the contact terminals of said display, establishing electrical connection therebetween.

23. The subassembly of claim 22 further including an insulating member encapsulating the integrated circuit chip and the inner ends of the conductor members of the lead frame, said insulating member being disposed behind and supporting the display.

24. The subassembly of claim 22 wherein the lead frame further includes a plurality of spaced component conductor members each having an inner end connected electrically to said chip and each having an outer end configured to provide circuit means associated with said chip.

25. The subassembly of claim 22 wherein the electrooptical display comprises first and second spaced, planar substrates having coextensive edges and carrying a pattern of transparent electrodes with the electrodes terminating at said edges in spaced electrode leads, said display including contact terminals spaced apart along said edges and coinciding in position with the position of said electrode leads to provide electrical connection therebetween.

26. A subassembly for an electronic timepiece comprising:
  a. a conductive lead frame carrying an integrated circuit chip, said lead frame having a plurality of spaced display conductor members each with an inner end connected electrically to said chip and each with an outer end formed into a resilient contact finger, the contact fingers being arranged in a first pattern to define an enclosure, and having a first pair of spaced component conductor members with inner ends connected electrically to said chip and with outer ends terminating in a pair of spaced capacitor leads, a second pair of spaced component conductor members with inner ends connected electrically to said chip and with outer ends terminating in a pair of spaced quartz crystal oscillator leads and a third pair of spaced component conductor members with inner ends connected electrically to said chip and with outer ends terminating in a pair of spaced switch contacts, b. a capacitor connected electrically to the first pair of capacitor leads, c. a quartz crystal oscillator connected electrically to the second pair of quartz crystal oscillator leads, and d. an electrooptical display disposed within said enclosure, said display having multiple display electrodes terminating along the edges of the display and having a plurality of spaced contact terminals connected to said electrodes on said edges in a second pattern complementary to the first pattern of resilient contact fingers such that each resilient contact finger frictionally engages a respective one of the contact terminals when the display is disposed in said enclosure, establishing electrical connection therebetween and releasably holding the display between said resilient contact fingers.

27. A module assembly for an electronic information display device, comprising:

a. a conductive lead frame carrying an integrated circuit chip and having spaced display conductor members connected electrically to said chip and terminating in a first pattern of spaced resilient contact fingers, b. an electrooptical display having multiple display electrodes terminating in spaced-apart relation along an edge of the display and having a plurality of spaced contact terminals connected to said display electrodes along said edge in a second pattern complementary to the first pattern of resilient contact fingers, and c. a front pod member and rear pod member between which the lead frame and electrooptical display are disposed in operative association with each resilient contact finger frictionally engaging a respective one of the contact terminals, establishing electrical connection therebetween, and with the electrooptical display facing the front pod member, said front pod member having an aperture therethrough to provide a window for viewing the display, said front pod member and rear pod member having holding means to hold them together with the lead frame and electrooptical display in operative association therebetween.

28. A module assembly for an electronic information display device, comprising:

a. a conductive lead frame carrying an integrated circuit chip and having display conductor members connected electrically to said chip and terminating in a single row of spaced resilient contact fingers, b. an electrooptical display having multiple display electrodes terminating in spaced apart relation along one edge of the display and having a plurality of spaced contact terminals connected to said electrodes along said one edge, and c. a front pod member and rear pod member between which the lead frame and electrooptical display are held in operative association with each resilient contact finger frictionally engaging a respective one of the contact terminals, establishing electrical connection therebetween, and with the electrooptical display facing said front pod member, said front pod member having an aperture therethrough to provide a window for viewing the display, said front pod member and rear pod member having holding means for holding them together with the lead frame and electrooptical display in operative assocation therebetween.

* * * * *